United States Patent [19]

Tihanyi et al.

[11] Patent Number: 4,817,854
[45] Date of Patent: Apr. 4, 1989

[54] LED SOLDERING METHOD UTILIZING A PT MIGRATION BARRIER

[75] Inventors: Peter L. Tihanyi, Yorktown Heights; Hubert J. Vollmer, Mahopac; Jeffrey S. Mott; Maryanne Sovak, both of Shenorock, all of N.Y.

[73] Assignee: The United States of America as represented by the Secretary of the Air Force, Washington, D.C.

[21] Appl. No.: 136,255

[22] Filed: Dec. 22, 1987

Related U.S. Application Data

[63] Continuation-in-part of Ser. No. 932,139, Nov. 17, 1986, which is a continuation-in-part of Ser. No. 710,505, Mar. 11, 1985, Pat. No. 4,623,086.

[51] Int. Cl.⁴ ............................................. B23K 31/02
[52] U.S. Cl. ..................................... 228/124; 228/123; 228/220
[58] Field of Search .............. 228/123, 124, 220, 231, 228/219, 263.18

[56] References Cited

U.S. PATENT DOCUMENTS

| | | | |
|---|---|---|---|
| 4,321,617 | 3/1982 | Duda et al. | 228/123 |
| 4,544,091 | 10/1985 | Hidler et al. | 228/124 |
| 4,623,086 | 11/1986 | Tihanyi et al. | 228/123 |

*Primary Examiner*—M. Jordan
*Attorney, Agent, or Firm*—Robert L. Nathans; Donald J. Singer

[57] ABSTRACT

Method of bonding a chip to a Cu heat sink comprises depositing a layer of Ni upon the sink, depositing a layer of Pt over the NI, and thereafter annealing the sink in a partial vacuum containing a reducing gas. After the annealing step, a metallic wetting layer of Au and a layer of In are sequentially deposited upon the Pt, and the chip is soldered to the heat sink by means of a flux free soldering process. The pure Pt is very dense and stable, does not have microholes therein which would otherwise allow the Cu ions to penetrate the Pt. For a BeO heat sink, a Ti layer is deposited over the sink rather than Ni, and a layer of Pt is thereafter deposited over the Ti layer. The Ti, Pt and BeO interact to form a good bond of high thermal conductivity, which also blocks ion migration upwardly toward the solder and the electronic chip.

20 Claims, 1 Drawing Sheet

LED SOLDERING METHOD UTILIZING A PT MIGRATION BARRIER

STATEMENT OF GOVERNMENT INTEREST

The invention described herein may be manufactured and used by or for the Government for governmental purposes without the payment of any royalty thereon.

CROSS REFERENCES TO RELATED APPLICATIONS

This application is a continuation in part of U.S. patent application Ser. No. 06/932,139 filed 11/17/86, which in turn is a continuation-in-part of U.S. patent application Ser. No. 710,505 filed Mar. 11, 1985, now U.S. Pat. No. 4,623,086 and entitled "Process of Monitoring for the Reflectivity Change in Indium Phase Transition Soldering."

BACKGROUND OF THE INVENTION

This invention relates to the field of soldering electronic chips, such as laser diodes to heat sinks.

Considerable problems have occurred upon attempts to form a good solder bond between an electronic chip such as an AlGaAs laser diode chip and a heat sink made of copper. Copper is highly mobile and thus copper ions will drift through various contiguous layers to penetrate an electronic chip such as an LED, and due to its highly reactive nature, "poisons" the LED to adversely affect proper operation thereof.

For space applications, Cu heat sinks are not acceptable; BeO heat sinks being required. Such heat sinks contain unbonded oxygen which must be blocked from the In solder layer positioned above the BeO. The resulting indium oxide weakens the soldered bond, and furthermore has poor thermal conductivity which reduces the efficiency of the heat sink. Also the BeO contains other contaminates that must be prevented from drifting into the LED.

SUMMARY OF THE INVENTION

It is thus an object of the present invention to provide a technique for solder bonding an electronic chip to a heat sink made of copper or BeO so that good bonding is effected and a high degree of heat conductivity is retained, enabling heat generated in the LED to rapidly flow to the Cu or BeO heat sink.

For a Cu heat sink, the preferred method of bonding the chip to the sink comprises depositing a layer of Ni upon the sink, depositing a layer of Pt over the Ni, and thereafter annealing the sink in a partial vacuum containing a reducing gas. After the annealing step, a metallic wetting layer of Au and a layer of In are sequentially deposited upon the Pt, and the chip is soldered to the heat sink by means of a flux free soldering process. The pure Pt is very dense and stable, does not have microholes therein which would otherwise allow the Cu ions to penetrate the Pt. The nickel layer is utilized to bond the Pt to the Cu heat sink.

In the case of the BeO heat sink, a Ti layer is deposited over the BeO rather than Ni, and a layer of platinum is thereafter deposited over the Ti layer. The Ti diffuses into the BeO and a tough TiOx compound is the result, which prevents indium migration toward the sink, so that the indium layer deposited over the platinum stays in place to perform its soldering function. Also, contaminates in the BeO are blocked from drifting into the LED to "poison" it, and oxygen is also blocked from the In solder to prevent the formation of indium oxide which weakens the soldered bond and has a poor thermal conductivity. Thus the Ti, Pt and BeO interact to form a good bond of high thermal conductivity, which also blocks ion migration upwardly toward the solder and the electronic chip.

BRIEF DESCRIPTION OF THE DRAWINGS

Other objects, features and advantages of this invention will become apparent upon study of the following detailed description, taken in conjunction with the drawings in which.

DETAILED DESCRIPTION OF PREFERRED EMBODIMENTS

Figure 1:
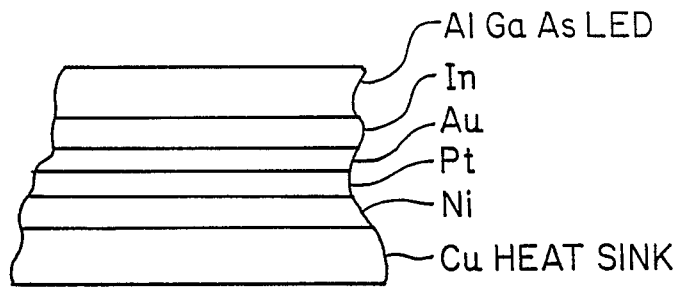
FIG. 1 illustrates the various layers employed in connection with the solder bonding of the chip upon a Cu heat sink.

Referring now to FIG. 1, a Ni layer having a thickness of between 1000–3000 angstroms is deposited upon the surface of the Cu heat sink and a layer of Pt having a most preferred thickness of about 3000 angstroms is thereafter deposited over the Ni. The Pt layer, in order to function as a good barrier as described above, must have a thickness of at least about 1500 angstroms. After the Pt is deposited over the Ni layer, the resulting product is annealed in a partial vacuum containing a reducing gas such as $H_2$ for a time period of between 5 and 50 minutes at a temperature of between 450–475 degrees C. We have also discovered that the Pt must be annealed in order to function as a good barrier as explained above. Upon termination of the annealing step, a metallic layer of Au is deposited upon the Pt layer, and a layer of In solder is thereafter deposited upon the Au layer which functions as a wetting layer. The chip is thereafter soldered to the resulting product by using a flux free soldering process such as the process described in U.S. Pat. No. 4,623,086, issued Nov. 18, 1986 to Tihanyi et al. The wetting layer should have a thickness of a few hundred angstroms.

Figure 2:
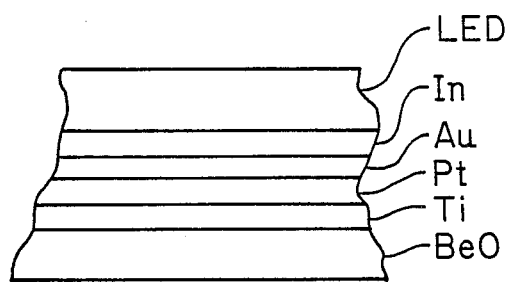
FIG. 2 illustrates the various layers utilized in the process of bonding the chip to a BeO heat sink.

Referring now to FIG. 2, a BeO heat sink is illustrated having a layer of Ti deposited thereon, such layer having a thickness of between 400–1000 angstroms. A Pt layer having a most preferred thickness of about 3000 angstroms is thereafter deposited over the Ti layer and the resulting product is annealed as described above. A gold wetting agent layer having a thickness of a few hundred angstroms, typically 500, is thereafter deposited over the pt layer, and the In solder layer, having a thickness of about 3 microns, is thereafter deposited over the Au wetting layer. The diode chip is then placed upon the indium solder and a flux free solder technique as mentioned above is employed to bond the chip to the BeO heat sink. Diffusion of Pt and Ti into the BeO sink produces a good bond and blocking layer which prevents the migrations previously discussed. This bond also has a high thermal conductivity, to maintain the efficient operation of the BeO heat sink. Migration of oxygen from the BeO to the In solder is also inhibited by this blocking layer. Should oxygen migrate to the In solder, the resulting indium oxide would create a weakened bond having a very poor thermal conductivity. Deposition of the first three layers is preferably carried out by plasma D.C. sputtering or electron gun evaporation. The fourth indium layer is preferably deposited by thermal evaporation. The BeO sink surface should be heated to a temperature of 200–300 degrees C. during the deposition of Ti thereon, to obtain good adhesion.

Thus, a key feature of the invention is to provide a migration barrier of pure Pt, which must be annealed to properly function in this role. We have also found however that time and temperature of annealing is not particularly critical. U.S. Pat. No. 4,321,617 to DUDA et al. teaches that tungsten will act as a good migration barrier. Our investigations however have indicated that tungsten will not block the migration of Cu to a satisfactory extent. Also, DUDA suggests the use of a layer of Pt as a wetting agent. However, he makes no suggestion of utilizing Pt as a migration barrier—to the contrary his Pt layer has a thickness of 500 angstroms which will not function as a migration barrier, since we have discovered that the Pt layer must be at least about 1500 angstroms thick, and most preferably about 3000 angstroms. Furthermore, in the product fabricated in accordance with this patent, it is submitted that Au would have to be utilized as the wetting agent, rather than Pt, since Au bonds well to In in contrast to pt. Furthermore, the Pt will be a good barrier only if annealed.

It should be understood that various modifications may be made with regard to the aforesaid steps, within the scope of the invention, which is to be limited only by the language of the following claims and art recognized equivalence thereof. For example, Mo, or TiW may be substituted for Ni in the case of the Cu heat sink. Cr may be substituted for Ti for the BeO sink, and a Sn solder may be substituted for the In solder.

What is claimed is:

1. A method of soldering an electronic chip to a heat sink made of material selected from the group consisting of Cu and BeO comprising the steps of:
   (a) adhering a layer of pure Pt of at least 1500 angstroms in thickness over said sink;
   (b) thereafter annealing said sink in a partial vacuum containing a reducing gas;
   (c) thereafter depositing a wetting layer and a layer of In solder upon said layer of Pt; and
   (d) soldering said chip to said heat sink by use of a flux free soldering process.

2. The method of claim 1 wherein said annealing is performed during a period of between 5 and 50 minutes at temperatures of between 450–475 degrees C.

3. A method of soldering an electronic chip to a heat sink made of BeO comprising the steps of:
   (a) depositing a layer of pure Ti upon said sink;
   (b) depositing a layer of pure Pt of at least 1500 angstroms in thickness upon said Ti;
   (c) thereafter annealing said sink in a partial vacuum containing a reducing gas;
   (d) sequentially depositing a wetting layer and a layer of In solder over said Pt; and
   (e) soldering said chip to said heat sink by use of a flux free soldering process.

4. The method of claim 3 wherein said annealing is performed during a period of between 5 and 50 minutes at temperatures of between 450–475 degrees C.

5. The method of claim 3 wherein said Ti layer has a thickness of between 400 and 1000 angstroms, and said wetting layer has a thickness of a few hundred angstroms.

6. The method of claim 5 wherein said Pt layer has a thickness of about 3000 angstroms.

7. The method of claim 3 wherein said In layer is deposited by thermal evaporation, and the remaining layers are deposited by sputtering or electron gun evaporation.

8. The method of claim 3 wherein said sink is heated to a temperature of between 200–300 degrees C. during the performance of Step (a).

9. The method of claim 4 wherein said Ti layer has a thickness of between 400 and 1000 angstroms, and said wetting layer has a thickness of a few hundred angstroms.

10. The method of claim 9 wherein said Pt layer has a thickness of about 3000 angstroms.

11. The method of claim 5 wherein said In layer is deposited by thermal evaporation, and the remaining layers are deposited by sputtering or electron gun evaporation.

12. The method of claim 9 wherein said In layer is deposited by thermal evaporation, and the remaining layers are deposited by sputtering or electron gun evaporation.

13. A method of soldering an electronic chip to a heat sink made of Cu comprising the steps of:
   (a) depositing a layer of Ni upon said sink;
   (b) depositing a layer of pure Pt of at least 1500 angstroms in thickness upon said Ni;
   (c) thereafter annealing said sink in a partial vacuum containing a reducing gas;
   (d) thereafter sequentially depositing a wetting layer and a layer of In solder upon said sink;
   (e) soldering said chip to said heat sink by use of a flux free soldering process.

14. The method of claim 13 wherein said annealing is performed during a period of between 5 and 50 minutes at temperatures of between 450–475 degrees C.

15. The method of claim 13 wherein said Ni layer has a thickness of between 1000 and 3000 angstroms, and said wetting layer has a thickness of a few hundred angstroms.

16. The method of claim 15 wherein said Pt layer has a thickness of about 3000 angstroms.

17. The method of claim 15 wherein said In layer is deposited by thermal evaporation, and the remaining layers are deposited by sputtering or electron gun evaporation.

18. The method of claim 14 wherein said Ni layer has a thickness of between 1000 and 3000 angstroms, and said wetting layer has a thickness of a few hundred angstroms.

19. The method of claim 18 wherein said Pt layer has a thickness of about 3000 angstroms.

20. The method of claim 18 wherein said In layer is deposited by thermal evaporation and the remaining layers are deposited by sputtering or electron gun evaporation.

* * * * *